(12) United States Patent
Sung et al.

(10) Patent No.: US 6,708,310 B1
(45) Date of Patent: Mar. 16, 2004

(54) METHOD AND SYSTEM FOR IMPLEMENTING USER-DEFINED CODESET CONVERSIONS IN A COMPUTER SYSTEM

(75) Inventors: Ienup Sung, Cupertino, CA (US); Thembile Mtwa, Mountain View, CA (US); Ashizawa Kazunori, Ikejiri (JP)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/371,616

(22) Filed: Aug. 10, 1999

(51) Int. Cl.[7] .............................................. G06F 17/21
(52) U.S. Cl. ...................................... 715/531; 717/140
(58) Field of Search ........................... 707/531; 341/90, 341/106; 345/467, 469; 717/140; 715/531

(56) References Cited

U.S. PATENT DOCUMENTS

| | | | | |
|---|---|---|---|---|
| 5,389,924 A | * | 2/1995 | Ogawa ........................ | 341/106 |
| 5,699,524 A | * | 12/1997 | Ooishi et al. .............. | 358/1.15 |
| 5,831,560 A | * | 11/1998 | Gelfenbain ................. | 341/106 |
| 5,898,874 A | * | 4/1999 | Gelfenbain ................. | 717/140 |
| 5,936,636 A | * | 8/1999 | Gelfenbain ................. | 219/497 |

OTHER PUBLICATIONS

Robin Burk et al., UNIX System Administrator's Edition (Sams Publishing: 1997), pp. 186–187.*
IBM, et. al, *AIX Version 4.3 General Programming Concepts: Writing and Debugging Programs*, "Codeset Overview"(USA, 1997).
IBM, et. al, *AIX Version 4.3 General Programming Concepts: Writing and Debugging Programs*, "Converters Overview for Programming" (USA, 1997).
IBM, et. al, *AIX Version 4.3 General Programming Concepts: Writing and Debugging Programs*, "Writing Converters Using the iconv Interface" (USA, 1997).
IBM, et. al, *Base Operating System and Extensions Technical Reference, vol. 1*, "iconv_open Subroutine" (USA, 1997).
IBM, et. al, *Base Operating System and Extensions Technical Reference, vol. 1*, "iconv Subroutine" (USA, 1997).
IBM, et. al, *Base Operating System and Extensions Technical Reference, vol. 1*, "iconv_close Subroutine" (USA, 1997).
IBM, et. al, *Base Operating System and Extensions Technical Reference, vol. 2*, "genxlt Command" (USA, 1997).
IBM, et. al, *Commands Refernece, vol. 1*, "iconv Command" (USA, 1997).
X/O Open Company, LTD., *X/Open CAE Specification*, "Commands and Utilities, Issue 4, Version 2" (Berkshire, U.K. 1992), pp. i–xx.
X/O Open Company, LTD., *X/Open CAE Specification*, "System Interfaces and Headers, Issue 4, Version 2" (Berkshire, U.K. 1992), pp. i–xxvi.

* cited by examiner

*Primary Examiner*—Sanjiv Shah
(74) *Attorney, Agent, or Firm*—Beyer Weaver & Thomas, LLP

(57) ABSTRACT

A method and system for performing user-defined code conversions in a computer system. A utility accepts a text file from a user program. This text file contains a series of conditional rules that define a protocol for converting character data between codesets. The utility parses this file and converts it to a binary table format that is then stored in a code conversion table database. The user program then invokes functions contained in the operating system to convert data in accordance with the stored binary table.

24 Claims, 4 Drawing Sheets

METHOD AND SYSTEM FOR IMPLEMENTING USER-DEFINED CODESET CONVERSIONS IN A COMPUTER SYSTEM

BACKGROUND OF THE INVENTION

1. Field of the Invention

The present invention relates generally to computer systems, and more specifically to user-defined codeset conversions, including operation-based code conversions.

2. Related Art

Computer systems communicate on many different computing platforms. The popularity of the Internet has led to an increased need to transfer documents between these platforms. Difficulties can arise, however, because differing platforms represent character data differently. An overview of character sets and codesets is helpful to understand these difficulties.

A character set is a collection of predefined characters based on the needs of a particular language or use environment. The character set can be composed of alphabetic, numeric, or other characters. Characters may be grouped in a set because they are needed to communicate in a given language or in a given specialized environment. Examples of character sets of the latter type include the symbols necessary to communicate mathematical or chemical formulas.

Once a character set is chosen, a remaining issue is how to represent that character set in a computer system. Collectively, the representation of all the characters of the character set is referred to as a codeset. The codeset defines a set of unambiguous rules that establish a one-to-one relationship between each character of the character set and that character's bit representation. This bit representation can be considered as a graphical image of the character. It is this image that is displayed on the computer screen and the printed page.

The codeset's representation can be dependent on the number of bytes used to represent each character, as well as the computer system's communication protocol. For example, a computer system using a 7-bit communication protocol often represents the same set of characters differently than a computer system using an 8-bit protocol. Thus, the choice of which codeset to use frequently depends on the user's data processing requirements.

For these reasons, two computer systems may employ different codesets even when working in the same language. Consider for example, the Japanese Industrial Standard character set. This character set can be encoded in a variety of codesets, including (1) standardized codesets such as eucJP, or ISO-2022-JP, (2) a user-defined subset of a standardized codeset, or (3) any other non-standard user-defined codeset. There will come a time, however, when these two computer systems need to exchange data. When this occurs, the data must be converted to the receiving computer's native character set. In the past, this has been done by using two approaches: one highly primitive and one highly complex.

The first conversion technique required the user to request a conversion by defining a series of simple one-to-one mappings. These mapping requests were then converted to a binary table. This technique was onerous because it required every mapping to be listed individually. And for multi-byte codesets, this technique was particularly problematic: The conversions often could not be expressed in terms of one-to-one mappings. And even if that was not the case, the resulting table sizes were too large for practical use.

The second conversion technique required the user to write algorithmic converters to a defined application program interface. These converters were typically written in the C programming language, or some other compiled language. As such, a compiler, linker, and debugger was needed to test and verify such converters. This complicated system often led to lengthy development cycles. This invention provides a valuable alternative.

INVENTION SUMMARY

Embodiments of the present invention provide methods and systems that facilitate codeset conversions. In a preferred embodiment, a user-defined text file assigns conversion rules between differing codesets. This text file is composed of one or more conditional, or operation-based, conversion elements. A utility evaluates the rules represented by these elements and produces a table that memorializes the rules in a binary file format. This binary file is then used to transform character data of a first codeset to character data of a second codeset. In this manner, the preferred embodiment converts data between differing codesets in an efficient manner. In fact, the preferred embodiment can convert data between differing multi-byte codesets and between multi- and single-byte codesets. The preferred embodiment does not require the writing of complex algorithmic converter functions and is not limited to primitive one-to-one mapping requests. Nor is the user required to compile the text file, as it is passed to the utility as a text file.

BRIEF DRAWING DESCRIPTIONS

The accompanying drawings illustrate embodiments of the invention that will enable those skilled in the art to make and utilize the invention. In fact, these drawings, when considered with the written disclosure, will enable those skilled in the art to modify these embodiments in a manner that does not depart from the spirit and scope of the invention.

FIG. 1 depicts a computer system that provides for user-defined code conversions in accordance with an embodiment of the present invention.

FIG. 2 provides an overview of logical steps employed in an embodiment of the present invention.

DETAILED DESCRIPTION

Embodiments of the invention will now be described with reference to the accompanying drawings. It is understood that the invention is not limited to these embodiments, as the teachings contained herein will enable others to modify these embodiments without departing from the spirit and scope of the invention. Accordingly, the invention encompasses all such modifications that are described by the appended claims and their equivalents.

Overview of the Detailed Description

The structure of this disclosure is as follows: A computer system embodying a preferred embodiment of the present invention is described. See FIG. 1. The description then includes a discussion of the syntax and the usefulness of a code conversion definition text file. Included in this discussion are examples of operation-based code conversion definition elements. A logical overview of a preferred embodiment is then described. This overview shows the steps of converting the user-defined code conversion definition file to a binary table that is later used to perform codeset conversions. See FIG. 2. The disclosure continues with more detailed explanations of the definition and conversion processes. See FIGS. 3 and 4. Appendix A provides a detailed version of the text file syntax in Backus-Naur form. Appendix B provides detailed examples of code conversion text files. Each appendix is incorporated into the detailed description by reference.

FIG. 1

The Computer System

Figure 1:
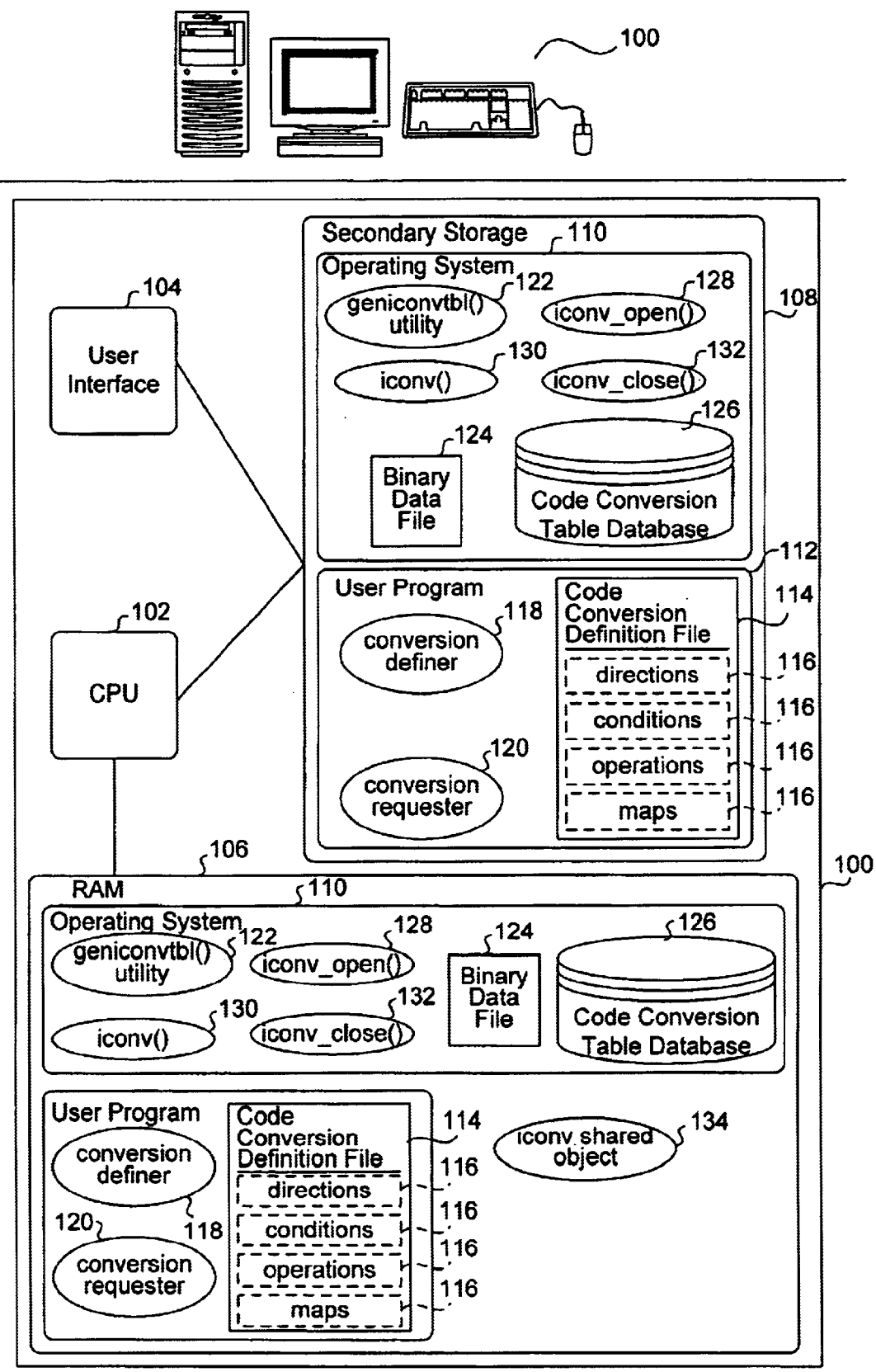

A computer system that provides for user-defined code conversions in accordance with an embodiment of the present invention is illustrated in FIG. 1. This system 100 includes an array of components: a central processing unit 102; a user interface 104, which typically consists of a keyboard, a mouse, and a monitor; a primary memory 106, such as a random access memory, for program execution; and a secondary memory 108, such as a disk, for storing programs and data that are not immediately needed for execution. Contained within memories 106, 108 are an operating system 110 that contains instructions and data for managing the computer's resources and a user program 112, that interacts with the operating system to convert data between codesets. In a preferred embodiment, the operating system 110 is based on the UNIX standard. Those skilled in the art will realize, however, that the present invention can be employed in any operating system.

The conversion process begins with the production of a user-defined code conversion definition text file 114, which is composed of a number of operation-based code definition elements 116. These elements 116 are conditional constructs that define the desired codeset conversion. By using these elements 116, codeset conversions can be defined using a text file that does not require individual mappings of each desired conversion. Nor is it necessary to write and debug complicated algorithmic converters. And since the text file 114 is passed to the operating system 110 as a flat text file, it does not have to be compiled by the user. All of these facets result in faster development cycles.

The user program 112 has two functional components: a conversion definer 118 and a conversion requester 120. The conversion definer 118 forwards the text file 114 to a utility of the operating system 110, the geniconvtbl( ) utility 122. In a preferred embodiment, this utility 122 is specifically designed to facilitate code conversions. It does this by accepting the text file 114 and converting it to a binary data file 124. The conversion definer 118 then stores that binary data file 124 in a code conversion table database 126 contained within the operating system 110. The user program's conversion requester 120 then interfaces with three operating system functions, which can be collectively referred to as the iconv subsystem, or individually referred to as iconv_open 128, iconv( ) 130, and iconv_close 132. These functions 128,130,132 perform the codeset conversion according to the rules circumscribed by the text file 114. They do this by instantiating a shared object 134 in RAM 106. In turn, this object 134 interfaces with the binary data file 124 to perform the conversion. To understand how the preferred embodiment accomplishes conversion, it is advantageous to examine the syntax and structure of the text file.

The Code Conversion Definition Text File

In a preferred embodiment, the conversion definition text file 114 is named by listing the "convert from" and "convert to" codesets separated by a percentage sign. Thus, the name for a text file defining the conversion rules for converting codeset data from US-ASCII to ISO8859-1 would be US-ASCII%ISO8859-1. The file 114 is composed of a number of the operation-based code conversion definition elements 116. As pictured, these elements can include directions, conditions, operations, and mappings.

Direction Conversion Definition Elements

In a preferred embodiment, direction elements represent the pinnacle of the code conversion definition element hierarchy. This is so because they are composed of one or more condition-action pairs. Each condition-action pair contains a condition element and an action element. If the predefined condition is met, the corresponding action will be executed. The condition can be (1) a predefined condition element, (2) a name to a predefined condition element, or (3) a condition literal value, true, which will always result in the corresponding action being executed. The action component of the element can be another direction element, an operation element, or a map element. Operation and map elements will be explained below. Condition elements will be explained now.

Condition Conversion Definition Elements

Condition conversion elements specify one or more condition expression elements in a preferred embodiment of the present invention. These condition expression elements can take three forms in this embodiment: (1) BETWEEN condition expression elements; (2) ESCAPE SEQUENCE condition expression elements, and (3) mathematical and logical condition expression elements, which are generically referred to as EXPRESSION elements.

The BETWEEN condition expression element is used to define conversion rules for codeset data contained within one or more comma-separated ranges. For example, the following defines a conversion rule using a direction that is composed of a condition-action pair that uses a BETWEEN condition expression element to apply a predefined operation to all codeset data in the ranges of 0x64 and 0x7f:

```
direction    {
    condition   {
        between 0x64...0x7f;
    } operation predefined_operation
}
```

The ESCAPE SEQUENCE condition expression element can be used to define one or more comma-separated escape sequence designators. For example, the following equates an escape sequence to ESC $ ) C and the Shift-Out control character code, 0x0e:

escapeseq 0x1b242943, 0x0e;

The EXPRESSION elements are legion and detailed in Appendix A, which is incorporated herein by reference. An illustrative example is the following multiplication expression:

0x20*10

Operation Conversion Definition Elements

Operation elements can be comprised of the following operation expression elements: (1) IF-ELSE operation expressions; (2) OUTPUT operation expressions; and (3) CONTROL operation expressions. An operation can be composed of any number or combination of operation expression elements.

The IF-ELSE operation expression element defines a conversion rule that is dependant on the outcome of the boolean result of the IF statement. If the result is true, the task that follows the IF statement is executed. If false, the task that follows the ELSE statement is executed. IF-ELSE statements can be nested to create more complex conversion rules. The following is representative syntax that generates an error message if the remaining output buffer is less than a predefined minimum. Else, the syntax creates a rule that generates an output codeset character representation by performing a logical AND on the input codeset character and the hexadecimal value 0x7f:

```
if (remaining_output_buffer < minimum) {
    error E2BIG
} else {
    output = input[current_character] & 0x7f
}
```

The OUTPUT operation expression element assigns the right-hand-side of the expression to the output buffer. For example, the following would save 0x8080 to the output buffer:

```
output=0x8080
```

In the preferred embodiment, the CONTROL operation expression can be used to (1) return error messages, (2) discard bytes from the input buffer pointer and move the input buffer accordingly, (3) stop the execution of the current operation, (4) execute an initialization operation and set all variables to zero; (5) execute a reset operation and set all variables to zero; (6) execute a predefined named operation, e.g., "operation ISO8859-1_to_ISO8859-2; (7) execute a predefined direction, or (8) execute a predefined mapping.

The syntax for CONTROL operation expression elements is shown in the attached Appendix A, which has been incorporated herein by reference. With "II" denoting a comment line, a representative syntax for conducting a reset operation is:

```
operation reset {
    // Emit state reset sequence
    output = predefined_reset_sequence
}
```

Mapping Conversion Definition Elements

In a preferred embodiment, mappings can specify a direct code conversion mapping by using one or more map pairs. Five possible pairings are (1) HEXADECIMAL-HEXADECIMAL, (2) HEXADECIMAL RANGE-HEXADECIMAL RANGE, (3) 'default'-HEXADECIMAL, (4) 'default'-'no_change_copy', and (5) HEXADECIMAL-ERROR. Respectively these mappings can be used to (1) convert a specified hexadecimal value to another hexadecimal value, (2) convert a specified range of hexadecimal values to another range of hexadecimal values, (3) convert an undefined input character to a defaulting hexadecimal value, (4) leave an undefined input character unchanged, and (5) return an error message when a particular input character is encountered. Each map element can also have comma-separated attribute elements. For example the mapping can be encoded as the following table types: dense, hash, binary search tree, index, or a automatically defined type. Illustrative syntax is:

```
// map with a hash mapping table, using hash factor of 10
map     maptype = hash:10;
// multiple or range mapping
// convert hexadecimal range of (0x0 to 0x10) to (0x10 to 0x8f)
0x0...0x7f      0x10;
// convert hex value of 0xa to 0xb
0xa             0xb
// convert undefined input codeset values to 0x20
default         0x20;
// return error is input buffer contains 0x80
0x80            error;
```

Thus, the preferred embodiment is not limited to simple one-to-one mappings. As a result, mappings can be efficiently defined.

Text File Syntax Summary

A summarized version of the syntax for the code conversion definition file is provided here. Again, a more detailed version of this syntax is provided in Backus-Naur Form in Appendix A.

```
Conversion Definition, e.g., US-ASCII%ISO8859-1
    Conversion Definition Elements
        Direction
            Condition: Action Pairs
                Condition
                    Between
                    Escape Sequence
                    Expression
                Action
                    Direction
                    Operation
                    Map
        Condition
        Operation
            Operation: Expression Elements
                If-Else Operation Expression
                Output Operation Expression
                Control Operation Expression
        Mapping
            Map Attributes
                index
                hash
                binary
                dense
            Map Pairs
                Single Mapping
                Multiple Mapping
                Default Mapping
```

Error Mapping

The use of the operational-based definition elements allows the preferred embodiment to provide for conversions not only between two single-byte codesets but also between multi-byte codes sets and bidirectional conversion between single- and multi-byte codesets. This is so because the operational elements of the code conversion definition file reduce the space needed to define the conversions. The text file 114 is also advantageous because of its ease of use: The file 114 is composed of concise declaration statements—not complicated instructions written in a program language such as C, which requires compilation before use. As such, the text file, when applied to the other inventive concepts disclosed herein, is a valuable tool for the computer industry. Complete examples of user-defined code conversion text files 114 are provided in Appendix B, which has been incorporated herein by reference.

Figure 2:
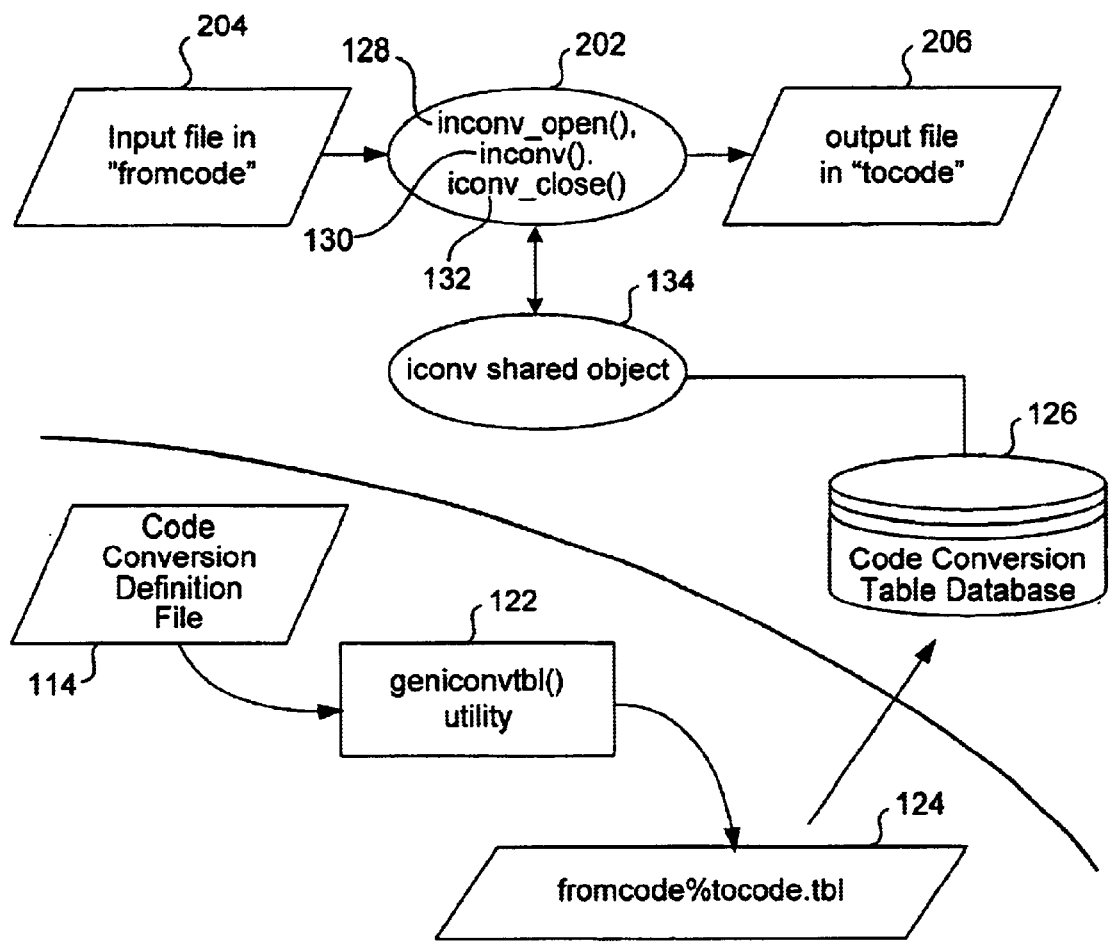

FIG. 2
Functional Overview

An overview of logical steps employed in an embodiment of the present invention to produce a code conversion binary table file from a user-defined code conversion text file and to convert codeset data in accordance with that binary table file is shown in FIG. 2. This process begins by defining the code conversion definition text file 114. Once this is done, it is passed to the geniconvtbl( ) utility 122, which interprets the text file 114 and converts it to a binary table file 124. This file transformation takes place to render the text file into a format that the iconv subsystem 202, represented by the functions iconv_open 128, iconv( ) 130, and iconv_close 132, can understand. Once the binary file 124 is produced, it is stored in the database 126. The user-defined codeset conversion is now available for use.

Actual conversion begins when character data in an input file 204 is transferred to the operation system by the user program. The iconv subsystem 202 recognizes that the user is requesting a conversion and instantiates the shared object 134 to retrieve the appropriate binary file 124 from the database 126. The subsystem 202 then interfaces with the shared object 134 to translate the data according to the protocol set forth in the binary file 124. The translated data is placed in an output file 206.

Figure 3:
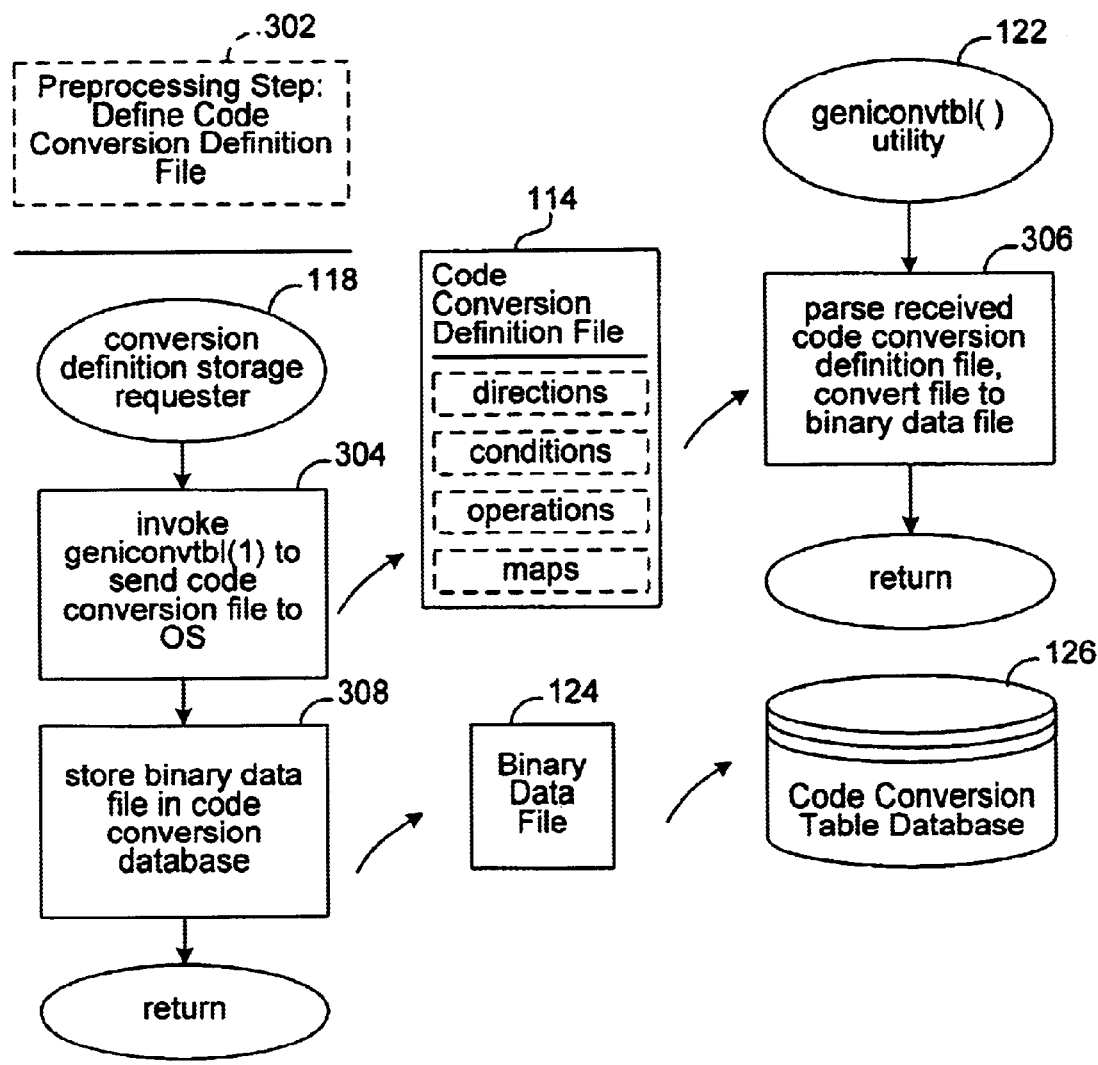
FIG. 3 is a flowchart illustrating steps used in an embodiment of the present invention to store a user-defined code conversion in a database.

FIG. 3
Defining the Codeset Conversion

The processing steps used in a preferred embodiment of the present invention to store a table representing user-defined code conversion rules are illustrated in FIG. 3. The embodiment begins with a preprocessing step: defining the codeset conversing rules via a code conversion definition file (step 302). Next the conversion definer 118 sends the text file 114 to the geniconvtbl( ) utility 122, which then parses the file for errors (steps 304, 306). If an error is found, the utility 122 returns an error message to the invoking user program 118. Otherwise, the utility 122 converts the text file 114 to a binary file 124 (step 306). Processing is then returned to the calling program 118, which stores the binary file 124 in the database 126 (step 308).

Figure 4:
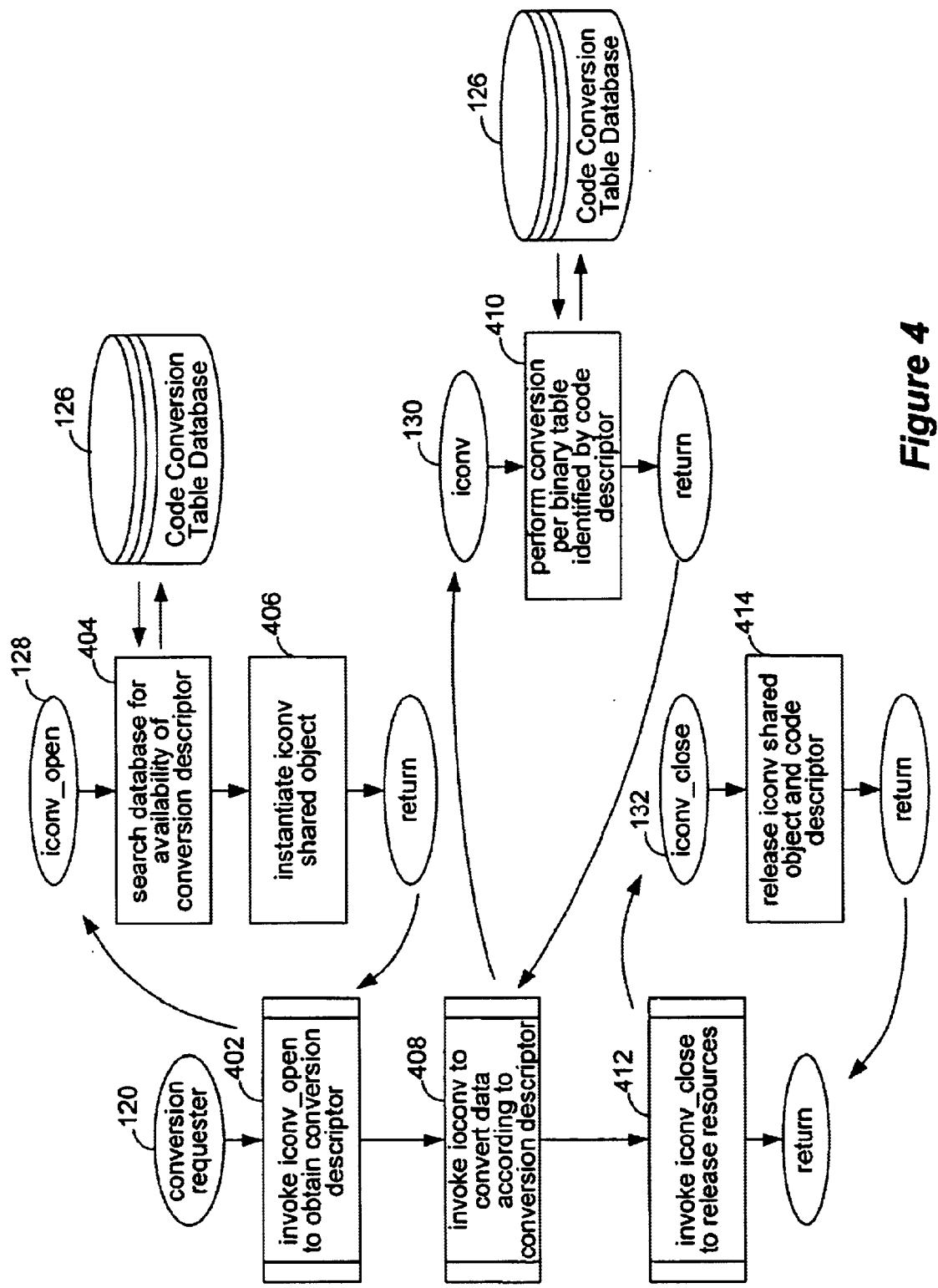
FIG. 4 is a flowchart detailing steps used in an embodiment of the present invention to convert codeset data in accordance with the user-defined code conversion.

FIG. 4
Performing the Codeset Conversion

The steps used in an embodiment of the present invention to convert codeset data is shown in FIG. 4. The processing begins when conversion requester 120 invokes iconv_open 128 to obtain a conversion descriptor for the desired conversion (step 402). In brief, this conversion descriptor contains pointers and data that the calling program 120 uses to later invoke iconvo 130. The conversion requester 120 invokes iconv_open 128 by passing to it the "from" and "to" codesets of the desired conversion. The function 128 then searches the database for a corresponding binary file (step 404). If no such file exists, an error message is returned to the invoking program 120. Else, the function 128 instantiates the shared object and returns control to the invoking program 120 (step 406). The conversion requester 120 next calls iconv( ) 130, which interfaces with the shared object to perform the conversion (steps 408, 410). The shared object performs the conversion by accessing the binary file stored in the database 126. Once the conversion is complete, control is again returned to the invoking program 120. The process is completed when the requester 120 calls iconv_close 132 to release the shared object and the conversion descriptor (steps 412, 414). In this manner, the preferred embodiment is able to efficiently convert data between differing codesets.

The above description will enable those skilled in the art to make numerous modifications to the described embodiments without departing from the spirt and scope of the claimed invention. Indeed, the chosen embodiments were selected so others could best utilize the invention by making such modifications to tailor the invention to their particular needs. The description therefore should not be read as limiting the invention to the embodiments explained herein.

For example, this disclosure has outlined several operation-based definition elements that can be incorporated into the code conversion definition text file. Using the inventive concepts disclosed herein, those skilled in the art may be able to create further such elements that, although not explicitly disclosed, are implicitly disclosed by the concepts of the invention.

Another possible modification is to store the text file—as opposed to the binary file—for use in subsequent conversions. In such a scenario, the utility would recall the text file from a database when a conversion is requested. The utility would then convert the text file to a binary file so that conversion could be effectuated.

Those skilled in the art will also recognize that the present invention is not limited to any particular CPU 102 or processing technology. Nor is the invention limited to any particular operating system 110. Rather, the invention could be utilized in any operating environment, such as WINDOWS 95, WINDOWS 98, UNIX, MacOS, or any JAVA runtime environment, which refers to the operating environment typified by a JAVA virtual machine and associated JAVA class libraries. JAVA is a registered trademark of SUN MICROSYSTEMS, Inc.

Similarly, the inventive concepts were described in part as being contained within random access memory and a hard disk. Those skilled in the art will recognize that these concepts can also be stored and invoked from any media that can store data or have data read from it. Examples of such media include floppy disks, magnetic tapes, phase discs, carrier waves sent across a network, and various forms ROM, such as DVDs and CDs. Thus, the present invention anticipates the use of all computer readable media.

Descriptive terms used in the above disclosure also do not limit the invention. For example, the term "user program" was used to describe a preferred embodiment. Those skilled in the art will realize that this term encompasses a variety of application programs and related technologies. Similarly, those skilled in the art will appreciate that the term "database" encompasses similar terms, such as file directories. The above disclosure also used the terms "operation-based conversion elements" and "conditional conversion elements" to explain inventive properties. While helpful for an understanding of the invention, these terms should not be read to limit the invention, as doing so would elevate form over substance. For these descriptive terms do not singularly define the invention. Rather, it is the properties that these terms represent, in conjunction with the entire disclosure, that are important. So long as these properties are being used, it makes little difference what terminology is used. The invention therefore is not circumvented by alterations in terminology or other modifications that read on the appended claims and their equivalents.

---

APPENDIX A
BACKUS-NAUR FORM FOR CODE CONVERSION DEFINITION TEXT FILE

--- iconv_conversion_definition
   :CONVERSION_NAME'{'definition_element_list'}'

APPENDIX A
BACKUS-NAUR FORM FOR CODE CONVERSION DEFINITION TEXT FILE

```
;
definition_element_list
    :definition_element';'
    |definition_element_list definition_element';'
    ;
definition_element
    :direction
    |condition
    |operation
    |map
    ;
direction
    :'direction'NAME'{'direction_unit_list'}'
    |'direction'"{'direction_unit_list'}'
    ;
direction_unit_list
    :direction_unit
    |direction_unit_list direction_unit
    ;
direction_unit
    :condition action';'
    |condition NAME';'
    |NAME action';'
    |NAME NAME';'
    |'true' action';'
    |'true' NAME';'
    ;
action
    :direction
    |map
    |operation
    ;
condition
    :'condition'NAME'{'condition list'"'}'
    |condition_list condition_expr';'
    ;
condition_list
    :condition_expr';'
    |condition_list condition_expr';'
    ;
condition_expr
    :'between'range_list
    |expr
    |'escapeseq'escseq_list';'
    ;
range_list
    :range_pair
    |range_list','range_pair
    ;
range_pair
    :HEXADECIMAL'...'HEXADECIMAL
    ;
escseq_list
    :escseq
    |escseq_list','escseq
    ;
escseq
    :HEXADECIMAL
    ;
map
    :'map'NAME'{'map_list'}'
    |'map'"{'map_list'}'
    |'map'NAME map_attribute'{'map_list'}'
    |'map'map_attribute'{'map_list'}'
    ;
map_attribute
    :map_type',"output_byte_length"'='DECIMAL
    |map_type
    |'output_byte_length"'='DECIMAL','map_type
    |'output_byte_length"'='DECIMAL
    ;
map_type
    :'maptype"'='map_type_name:DECIMAL
    |'maptype"'='map_type_name
    ;
```

APPENDIX A
BACKUS-NAUR FORM FOR CODE CONVERSION DEFINITION TEXT FILE

```
map_type_name
    :'automatic'
    |'index'
    |'hash'
    |'binary'
    |'dense'
    ;
map_list
    :map_pair
    |map_list map_pair
    ;
map_pair
    :HEXADECIMAL HEXADECIMAL
    |HEXADECIMAL'...'HEXADECIMAL
    |'default'HEXADECIMAL
    |'default"no_change_copy'
    |HEXADECIMAL'error'
    ;
operation
    :'operation'NAME'{'op_list'}'
    |'operation'"{'op_list'}'
    |'operation'"init'{'op_list'}'
    |'operation'"reset'{'op_list'}'
    ;
op_list
    :op_unit
    |op_list op_unit
    ;
op_unit
    :';'
    |expr';'
    |'error'";'
    |'error'expr';'
    |'discard'";'
    |'discard'expr';'
    |'output'"'='expr';'
    |'direction'NAME';'
    |'operation'NAME';'
    |'operation'"init'";'
    |'operation'"reset'";'
    |'map'NAME';'
    |'map'NAME expr';'
    |op_if_else';'
    |'return'";'
    |'printch'expr';'
    |'printhd'expr';'
    |'printint'expr';'
    ;
op_if_else
    :'if'"('expr')'"{'op_list'}'
    |'if'"('expr')'"{'op_list'}'"else'op_if_else
    |'if'"('expr')'"{'op_list'}'"else'"{'op_list'}'
    ;
expr
    :'('expr')'
    |NAME
    |HEXADECIMAL
    |DECIMAL
    |'input'"['expr']'
    |'outputsize'
    |'inputsize'
    |'true'
    |'false'
    |'input'"'=='expr
    |'expr'"'=='input'
    |'!'expr              // false expression
    |'~'expr              // bitwise complement expression
    |'-'expr              // unary minus expression
    |expr'+'expr
    |expr'-'expr
    |expr'*'expr          // multiplication expression
    |expr'/'expr
    |expr'%'expr          // remainder expression
    |expr'<<'expr         // left-shift expression
    |expr'>>'expr         // right-shift expression
```

-continued

APPENDIX A
BACKUS-NAUR FORM FOR CODE CONVERSION DEFINITION
TEXT FILE

```
|expr'|'expr          // bitwise OR expression
|expr' ^ 'expr        // exclusive OR expression
|expr'&'expr          // bitwise AND expression
|expr'=='expr         // equal-to expression
|expr'!='expr         // inequality expression
|expr'>'expr
|expr'>='expr
|expr'<'expr
|expr'<='expr
|NAME'='expr
|expr'||'expr         // logical OR
|expr'&&'expr         // logical AND
;
```

APPENDIX B
CODE CONVERSION DEFINITION TEXT FILE EXAMPLES

```
Example 1: Code Conversion from ISO 8859-1 to ISO 646
// Iconv code conversion from ISO 8859-1 to ISO 646
ISO8859-1%ISO646
{
    // Use dense-encoded internal data structure
    map maptype = dense
    {
        default 0x3f;
        0x0...0x7f      0x0;
    };
}
Example 2: Code Conversion from eucJP to ISO-2022-JP
// Iconv code conversion from eucJP to ISO-2022-JP
# include <sys/errno.h>
euJP%ISO-2022-JP    {
    operation init      {
        // set codesubset to ASCII
        codesubset=1
    };
    operation reset     {
        If (codesubset != 0)    {
            // Emit state reset sequence, ESC (J for ISO-2202-JP)
            output = 0x1b284a;
        }
        operation init;
    };
    direction   {
        condition       {       //JIS x 0201 Latin (ASCII)
            between 0x00...0x7f;
        }operation      {
            if (codesubset != 0)        {
                // we will emit four bytes
                If (outputsize <=3)         {
                    error E2BIG
                }
                // Emit state reset sequence, ESC (J.
                output = 0x1b284a
                // set codesubset to ASCII
                codesubset = 0;
            } else {
                if outputsize <=0)
                    error E2BIG
                }
            }
            output = input [0];
            // Move input buffer pointer one byte.
            discard;
        };
        condition   {       // JIS x 0208
            between 0xa1a1...0xfefe;
        }operation  {
            if (codesubset != 1)        {
                if (outputsize <=4)     {
```

-continued

APPENDIX B
CODE CONVERSION DEFINITION TEXT FILE EXAMPLES

```
                    error E2BIG
                }
                // Emit JIS x 0208 sequence, ESC $ B.
                output = 0x1b2442
                codesubset = 1
            } else {
                if outputsize <=1)
                    error E2BIG
                }
            }
            output = input [0] & 0x7f;
            output = input [1] & 0x7f;
            // Move input buffer pointer two bytes.
            discard 2;
        };
        condition       {       // JIS x 0201 Kana
            between 0x8ea1...0x8edf;
        }operation      {
            if (codesubset != 2)        {
                if (outputsize <=3)     {
                    error E2BIG
                }
                // Emit JIS x 0201 Kana sequence, ESC (I.
                output = 0x1b2849
                codesubset = 2
            } else {
                if outputsize <=0)
                    error E2BIG
                }
            }
            output = input [1] & 127;
            // Move input buffer pointer two bytes.
            discard 2;
        };
        condition       {       //JIS x 0212
            between 0x8fa1a1...0x8ffefe;
        } operation     {
            if (codesubset != 3)        {
                if (outputsize <=5)     {
                    error E2BIG
                }
                // Emit JIS x 0212 sequence, ESC $ (D.
                output = 0x1b242844
                codesubset = 3
            } else {
                if outputsize <=1)
                    error E2BIG
                }
            }
            output = input [1] & 127;
            output = input [2] & 127;
            // Move input buffer pointer three bytes.
            discard 3;
        };
        true    operation { // error
            error EILSEQ
        };
    };
}
```

What is claimed is:

1. A computer system, comprising:

an operating system;

an operating system memory;

a code conversion definition text file that is contained within the operating system memory and that is composed of a plurality of operation-based code conversion definition elements, wherein an operation-based code conversion definition element can be a direction conversion definition element, a condition conversion definition element, an operation conversion definition element, or a mapping conversion definition element; and a code-generating operating system utility that is contained within the operating system memory and can be invoked when the text file is received, the code-generating operating system operating to:
- parse the at least one operation-based code conversion definition element when the code-generating operating system utility is invoked;
- generate, based on the parsing of the at least one operation-based code conversion definition element, a representation of the text file;
- store in the operating system the representation of the received text file in a code conversion database for use in subsequent codeset conversions; and
- a binary file contained in the memory, the binary file specifying rules for converting character data from a first codeset to a second codeset, the binary file having been produced, by the code generating operating system utility, from the code conversion definition text file which is composed of a plurality of operation-based code conversion definition elements.

2. The computer system of claim 1, wherein the operation-based code conversion definition elements that form the code conversion definition text file comprise a plurality of operation elements.

3. The computer system of claim 2 wherein at least one of the operation elements comprises an IF-THEN operation.

4. The computer system of claim 2 wherein at least one of the operation elements comprises an OUTPUT operation.

5. The computer system of claim 2 wherein at least one of the operation elements comprises a CONTROL operation.

6. The computer system of claim 1 wherein the operation-based code conversion definition elements that form the code conversion definition text file comprise a plurality of direction elements, where each direction element is comprised of a condition-action pair, where a condition component of the pair identifies a conditional test and where an action component of the pair specifies an action that is to be taken when the conditional test is satisfied.

7. The computer system of claim 1 wherein the operation-based code conversion definition elements that form the code conversion definition text file comprise a plurality of condition elements, where each condition element is comprised of a condition and an expression.

8. The computer system of claim 7 wherein at least one of the condition elements comprises a BETWEEN condition.

9. The computer system of claim 7 wherein at least one of the condition elements comprises an ESCAPE SEQUENCE.

10. The computer system of claim 1 wherein the operation-based code conversion definition elements that form the code conversion definition text file comprise a plurality of mapping elements.

11. The computer system of claim 10 wherein at least one of the mapping elements defines a default mapping.

12. The computer system of claim 11 wherein at least one of the mapping elements defines a range mapping.

13. A method for facilitating codeset conversions in a computer system, the method comprising the steps of:
- receiving, in an operating system utility that is implemented in an operating system of the computer system, and that is also specifically designed to facilitate codeset conversions, a text file that specifies operational rules for converting character data from a first codeset to a second codeset, wherein the operational rules are composed of at least one operation-based code conversion definition element, and wherein the at least one operation-based code conversion definition element is a direction conversion definition element, a condition conversion definition element, an operation conversion definition element, or a mapping conversion definition element;
- invoking a code-generating operating system utility when the text file is received; parsing, by code-generating operating system utility, the at least one operation-based code conversion definition element when the code-generating operating system utility is invoked;
- generating, by the code-generating operating system utility, based on the parsing of the at least one operation-based code conversion definition element, a representation of the text file; and
- storing, by the code-generating operating utility, operating system the representation of the text file in a code conversion database for use in subsequent codeset conversions.

14. The method of claim 13, further comprising the steps of:
- upon receipt of the text file, converting it to a binary file; and
- identifying the binary file as the representation of the received text file to be stored in the database.

15. The method of claim 13, further comprising the steps of:
- receiving data that is requested to be converted in accordance with the received text file;
- retrieving the representation of the received text file from the data base; and
- using the retrieved representation to convert the data from the first codeset to the second codeset.

16. The method of claim 13, further comprising the steps of:
- receiving data that is requested to be converted in accordance with the received text file;
- retrieving the received text file from the database;
- converting the received text file to a binary file; and
- using the binary file to convert the character data from the first codeset to the second codeset.

17. A method as recited in claim 13, wherein the method further comprises: converting character data from a first codeset to a second codeset, by the one or more other operating system utilities, based on the representation generated by the code-generating operating system utility which is provided as input to the one or more other operating system utilities.

18. A method as recited in claim 13, wherein the method further comprises:
- providing one or more other operating system utilities that can collectively search the code conversion database, establish a shared interface, and use the shared interface to access the representation of the received text file, which is stored in the code conversion database, to perform the codeset conversion in accordance with the at least one operation-based code conversion definition element.

19. A method as recited in claim 18, wherein the method further comprises:
- receiving a request to perform a codeset conversion;
- invoking a first operating system utility of the one or more other operating system utilities when the request if received;
- searching the code conversion database, by the first operating system utility, to determine whether the code conversation information needed to perform the conversion is in the code conversion database;

instantiating, by the first operating system utility, a shared object when it is determined that the code conversation information needed to perform the conversion is in the code conversion database; and invoking a second operating system utility of the one or more other operating system utilities, wherein the second operating utility interfaces with the shared object, and wherein the shared objects performs the codeset conversion by accessing the representation of the received text file which is stored code conversion database.

20. A method as recited in claim 19, wherein the method further comprises:

releasing the shared object by a third operating system utility.

21. A computer readable medium including computer program code for facilitating codeset conversions in a computer system, said computer readable medium comprising:

computer program code for receiving, in an operating system utility that is implemented in an operating system of the computer system, and that is also specifically designed to facilitate codeset conversions, a text file that specifies operational rules for converting character data from a first codeset to a second codeset, wherein the operational rules are composed of at least one operation-based code conversion definition element, and wherein the at least one operation-based code conversion definition element is a direction conversion definition element, a condition conversion definition element, an operation conversion definition element, or a mapping conversion definition element;

computer program code for invoking a code-generating operating system utility when the text file is received;

computer program code for parsing, by code-generating operating system utility, the at least one operation-based code conversion definition element when the code-generating operating system utility is invoked;

computer program code for generating, by the code-generating operating system utility, based on the parsing of the at least one operation-based code conversion definition element, a representation of the text file; and computer program code for storing, by the code-generating operating utility, in the operating system the representation of the received text file in a code conversion database for use in subsequent codeset conversions.

22. A computer program medium as recited in claim 21, wherein the computer readable medium further comprises:

computer program code for providing one or more other operating system utilities that can collectively search the code conversion database, establish a shared interface, and use the shared interface to access the representation of the received text file, which is stored in the code conversion database, to perform the codeset conversion in accordance with the at least one operation-based code conversion definition element.

23. A computer program medium as recited in claim 22, wherein the computer readable medium further comprises:

computer readable code for receiving a request to perform a codeset conversion;

computer readable code for invoking a first operating system utility of the one or more other operating system utilities when the request if received;

computer readable code for searching the code conversion database, by the first operating system utility, to determine whether the code conversation information needed to perform the conversion is in the code conversion database;

computer readable code for instantiating, by the first operating system utility, a shared object when it is determined that the code conversation information needed to perform the conversion is in the code conversion database; and computer readable code for invoking a second operating system utility of the one or more other operating system utilities, wherein the second operating utility interfaces with the shared object, and wherein the shared objects performs the codeset conversion by accessing the representation of the received text file which is stored code conversion database.

24. A computer program medium as recited in claim 23, wherein the computer readable medium further comprises:

computer program code for releasing the shared object by a third operating system utility.

* * * * *

UNITED STATES PATENT AND TRADEMARK OFFICE
CERTIFICATE OF CORRECTION

PATENT NO.   : 6,708,310 B1
DATED        : March 16, 2004
INVENTOR(S)  : Sung et al.

It is certified that error appears in the above-identified patent and that said Letters Patent is hereby corrected as shown below:

<u>Column 14,</u>
Line 25, "utility, operating system" should read -- utility, in the operating system --.

<u>Column 16,</u>
Line 7, "request if needed" should read -- request is needed --.

Signed and Sealed this

Twenty-fourth Day of August, 2004

JON W. DUDAS
*Director of the United States Patent and Trademark Office*